(12) United States Patent
Peibst

(10) Patent No.: US 10,707,368 B2
(45) Date of Patent: Jul. 7, 2020

(54) SOLAR CELL HAVING A PLURALITY OF ABSORBERS CONNECTED TO ONE ANOTHER BY MEANS OF CHARGE-CARRIER-SELECTIVE CONTACTS

(71) Applicant: INSTITUT FÜR SOLARENERGIEFORSCHUNG GMBH, Emmerthal (DE)

(72) Inventor: Robby Peibst, Springe (DE)

(73) Assignee: INSTITUT FÜR SOLARENERGIEFORSCHUNG GMBH (DE)

( * ) Notice: Subject to any disclaimer, the term of this patent is extended or adjusted under 35 U.S.C. 154(b) by 0 days.

(21) Appl. No.: 15/776,630

(22) PCT Filed: Nov. 17, 2016

(86) PCT No.: PCT/EP2016/078005
§ 371 (c)(1),
(2) Date: May 16, 2018

(87) PCT Pub. No.: WO2017/085186
PCT Pub. Date: May 26, 2017

(65) Prior Publication Data
US 2018/0374976 A1 Dec. 27, 2018

(30) Foreign Application Priority Data
Nov. 19, 2015 (DE) .................. 10 2015 015 017

(51) Int. Cl.
*H01L 31/00* (2006.01)
*H01L 31/078* (2012.01)
(Continued)

(52) U.S. Cl.
CPC .............. *H01L 31/078* (2013.01); *H01G 9/20* (2013.01); *H01L 31/0725* (2013.01);
(Continued)

(58) Field of Classification Search
CPC .. H01L 31/0725; H01L 31/043; H01L 31/078
See application file for complete search history.

(56) References Cited

U.S. PATENT DOCUMENTS

| 4,253,882 A | 3/1981 | Dalal |
| 4,496,788 A | 1/1985 | Hamakawa et al. |
| (Continued) | | |

FOREIGN PATENT DOCUMENTS

| DE | 10 2008 045 522 A1 | 3/2010 |
| DE | 10 2008 055 036 A1 | 7/2010 |
| (Continued) | | |

OTHER PUBLICATIONS

Mailoa et al., "A 2-terminal perovskite/silicon multijunction solar cell enabled by a silicon tunnel junction," Applied Physics Letters 106, 121105 (2015) (Year: 2015).*

(Continued)

*Primary Examiner* — Angelo Trivisonno
(74) *Attorney, Agent, or Firm* — Dresch IP Law, PLLC; John J. Dresch

(57) ABSTRACT

A tandem solar cell structure is described with the following features:
(a) Monolithic configuration with at least two different absorbers (104, 108) of different materials for photovoltaic energy conversion
(b) an absorber (108) consisting of crystalline silicon
(c) a charge carrier selective contact arranged on the side of the silicon absorber (108) directed to the adjacent absorber (104)
(d) configuration of the charge carrier selective contact from a thin interface oxide 107 and an amorphous, partially crystalline or polycrystalline layer applied thereto, mainly consisting of silicon, either p (106) or n doped (201)
The charge carrier selective contact made up of layers 107 and 106 or 201, respectively, ensures excellent surface (Continued)

passivation of the crystalline silicon absorber 108, as well as selective extraction of a charge carrier type from the latter over the entire surface. Thus, a vertical current flow is achieved, so that lateral transverse conductivity is not required in every sub-cell. The formation of a tunnel contact to the adjacent layer may be achieved by high doping of the layers 106 and 201. The thickness and/or the doping of the layers 106 and 201 may be used to match the generation currents in the individual sub-cells. The temperature stability of layers 107, 106 or 201, respectively, allows the application of subsequent manufacturing steps with temperatures >400° C.

15 Claims, 2 Drawing Sheets

(51) Int. Cl.
- *H01L 31/0725* (2012.01)
- *H01L 31/0747* (2012.01)
- *H01G 9/20* (2006.01)
- *H01L 51/42* (2006.01)

(52) U.S. Cl.
CPC ...... *H01L 31/0747* (2013.01); *H01L 51/4213* (2013.01); *Y02E 10/50* (2013.01)

(56) References Cited

U.S. PATENT DOCUMENTS

| | | | | |
|---|---|---|---|---|
| 2006/0255340 | A1* | 11/2006 | Manivannan | H01L 31/02168 257/79 |
| 2009/0308438 | A1 | 12/2009 | De Ceuster et al. | |
| 2012/0152340 | A1* | 6/2012 | Kondo | H01L 31/043 136/255 |
| 2016/0126401 | A1* | 5/2016 | Iannelli | H01L 31/078 136/244 |

FOREIGN PATENT DOCUMENTS

| | | |
|---|---|---|
| WO | 2014045021 A1 | 3/2014 |
| WO | 2016 090 179 A1 | 6/2016 |

OTHER PUBLICATIONS

Nathalie Persat, International Search Report dated Feb. 10, 2017.
National Search Report issued in an Office Action, German Application No. 10 2015 015 017 A1 dated May 24, 2017.
Steve Albrecht et a l: "Monolithic perovskite/silicon-heterojunction tandem solar cells processed at low temperature", Energy & Environmental Science, vol. 9, No. I, Oct. 27, 2015 (Oct. 27, 2015). pp. 81-88, XP055341828, UK, ISSN: 1754-5692, DOI: 10.1039/C5EE02965A, the whole document.
Youngseo K Lee et al : :Ultrathin Oxide Passivation Layer by Rapid Thermal Oxidation for the Silicon Heterojunction Solar Cell Applications, International Journal of Photoenergy, vol . 2012, Jan. 1, 2012 (Jan. 1, 2012) , pp. 1-5, XP055342085, US, ISSN: 1110-662X, DOI: 10.1155/2012/753456, the whole document.
Green M.A: "Si licon Wafer-Based Tandem Cells : The Ultimate Photovoltaic Solution?", Proceedings / EU PVSEC 2013, 28th European Photovoltaic Solar Energy Conference and Exhibition, Dec. 16, 2013 (Dec. 16, 2012) , pp. 7-10, XP040634740, ISBN: 978-3-936338-33-1, figure 4.
Symko-Davi es M. : "Progress in High-Performance PV: Polycrystalli ne Thin-Film Tandem Cells", Nineteenth European Photovoltaic Solar Energy Conference : Proceedings of the International Conference Held in Paris, France, Jun. 7-11, 2004, Jun. 7, 2004 (Jun. 7, 2004), pp. 1651-1656, XP040510788, ISBN: 978-3-936338-15-7, figure 4.
Sivananthan S.: "Mu ltijunction Single-Crystal CdTe-Based Solar Cells : Opportunities and 2 Challenges", Proceedings of Spi e, Jan. 1, 2010 (Jan. 1, 2010) , pp. 1-14, XP040536867, table 2.
Guy Beaucarne: "Silicon Thin-Film Solar Cells", Advances in Optoelectronics, vol . 2007, Jan. 1, 2007 (Jan. 1, 2007) , pp. 1-12, XP055148385, DOI: 10.1155/2007/36970, figure 5.
Feldmann Fran K et al : "Efficient carrier-selective p- and n-contacts for Si solar cells", Solar Energy Materials and Solar Cells, Elsevier Science Publishers, Amsterdam, N L, vol . 131, Jun. 30, 2014 )Jun. 30, 2014), pp. 100-104, XP029075017, ISSN: 0927-0248, DOI: 10.1016/J.SOLMAT.2014.05.039, the whole ocument.
Martin Jaumann, National Search Report issued in an Office Action dated Sep. 17, 2019, German Application No. 10 2015 015 017.0.
Jonathan P. Mailoa et al., "A 2-terminal perovskite/silicon multijunction solar cell enabled by a silicon tunnel junction", Published online Mar. 24, 2015, In: Applied Physics Letters, Bd. 12, Mar. 23, 2015, Nr. 106, S. 121105-1-121105-4.—ISSN 0003-6951.

* cited by examiner

SOLAR CELL HAVING A PLURALITY OF ABSORBERS CONNECTED TO ONE ANOTHER BY MEANS OF CHARGE-CARRIER-SELECTIVE CONTACTS

FIELD OF INVENTION

The present invention relates to a solar cell, in particular to a tandem solar cell with several absorbers.

TECHNICAL BACKGROUND

Solar cells are used to convert the energy of sunlight into electrical energy using the photoelectric effect. Depending on the absorber material, however, only a certain part of the solar spectrum may be used efficiently. For example, if the absorber is made of a semiconductor material, photons with energies below the band gap may not contribute directly to the generation of electron-hole pairs and are therefore hardly absorbed. Photons with energies far above the band gap generate electron-hole pairs, but electrons and holes from the excited higher-energy states thermalize into low-energy states near the band edges and therein release the energy difference in the form of heat.

One way to minimize these two loss mechanisms in the area of high- and low-energy photons is to use two or more absorbers made of different materials that efficiently convert radiation energy from different areas of the solar spectrum into electrical energy. The absorber or absorbers that efficiently use high-energy photons for the photovoltaic energy conversion and efficiently transmit the photons with lower energies to the underlying absorber(s) are located on a side of the solar cell facing the solar irradiation.

This solar cell structure, known as a tandem solar cell or multijunction cell, has long been known, for example from the U.S. Pat. No. 4,496,788, and has already been commercialized in the area of highly efficient space solar cells or in the area of terrestrial solar cells, where sunlight is concentrated via optics onto a small area.

It would also be desirable to be able to also use tandem solar cells for terrestrial, non-concentrating photovoltaic applications. To achieve this, however, the high manufacturing and material costs of conventional tandem solar cells must be significantly reduced. For this purpose, tandem solar cells may be based on relatively inexpensive and relatively efficient (mono- or multi-) crystalline silicon solar cells, i.e. one or more absorbers made of materials other than crystalline silicon may be applied to the silicon absorber. Materials would be possible which allow photovoltaic energy conversion for photon energies below the silicon band gap of 1.12 eV, wherein such an absorber would be applied to the side of the silicon absorber facing away from solar radiation. Alternatively, absorbers made of materials that efficiently transmit photons with energies below 1.4 eV and efficiently use higher-energy photons for the photovoltaic energy conversion could be applied to the side of the silicon absorber facing the solar irradiation.

Silicon solar cells with only one pn-junction are constantly being developed further. A significant improvement in energy conversion efficiency may be achieved by improving the quality of the surface passivation. Dielectric passivation layers, such as silicon oxides (SiOx), silicon nitrides (SiNx) or aluminum oxides (Al2O3), electrically insulate the respective covered areas, so that additional non-passivated contacts are required for the extraction of charge carriers. Typically, a metal borders locally directly on the crystalline silicon, forming a defective and therefore highly recombination-active interface. In contrast, so-called charge carrier selective contacts offer the possibility not only of passivating the surfaces covered with them excellently, but also of selectively extracting one charge carrier type, i.e. either electrons or holes, from the silicon absorber in these areas.

The term "charge carrier selective contact" comprises different embodiments. The best known for this in the field of silicon photovoltaics are heterojunctions between amorphous, hydrogen-rich silicon and the crystalline silicon absorber. However, the electrical properties of these heterojunctions often degrade strongly at temperatures above 200° C. An alternative known from bipolar electronics, which has been increasingly investigated in photovoltaics in recent years, are charge carrier selective contacts consisting of a thin interfacial oxide (or more generally from an interfacial dielectric) and a layer of doped amorphous or partially crystalline or polycrystalline silicon deposited thereon. The interfacial oxide is partly also called tunnel oxide, wherein the dominant physical current transport mechanism through the oxide is still the subject of current scientific debates. Depending on whether the amorphous or partially crystalline or polycrystalline silicon layer on the interface oxide is doped n or p, the charge carrier selective contact is either transparent, respective permeable, for electrons or holes and blocks the other charge carrier type near the interface between the oxide and the silicon absorber. Charge carrier selective contacts consisting of a thin interfacial oxide and a layer of doped amorphous or partially crystalline or polycrystalline silicon deposited thereon are usually stable at process temperatures up to at least 1050° C. Their excellent passivation quality is typically independent of the type of layers on them.

SUMMARY OF THE INVENTION AND OF EMBODIMENTS

There may be a need for a tandem solar cell that is highly efficient and/or may be produced easily and cost-effectively.

In particular, there may be a need to design a tandem solar cell with crystalline silicon as an absorber material such that the surface of the silicon absorber facing the other absorber is very well passivated so that recombination of electrons generated in the silicon absorber and holes on this surface of the silicon absorber is minimized regardless of the properties of the layers adjacent to this passivation.

There may be a need to design a tandem solar cell with crystalline silicon as a material for the absorber so that one type of charge carrier may be extracted very efficiently on the surface of the silicon absorber facing the other absorber, so that the sub-cell consisting mainly of the silicon absorber is electrically well connected to the adjacent sub-cell.

There may also be a need to form a tunnel contact between the sub-cell consisting mainly of the crystalline silicon absorber and the sub-cell consisting mainly of another absorber material.

There may also be a need to design a tandem solar cell with crystalline silicon as material for an absorber so that additional possibilities for fine adjustment of the current densities generated in the sub-cells arise.

There may also be a need to use a manufacturing process in which certain steps imply process temperatures above 200° C. in the manufacture of a tandem solar cell with crystalline silicon as a material for an absorber.

The first needs may be met by the subject matter of the independent claim of the present application. The needs also mentioned may be satisfied by the subject matter of at least one of the dependent claims of the present application.

According to an aspect of the present invention, a tandem solar cell structure is described which has at least two absorbers for converting radiant energy into electrical energy, a first absorber consisting of crystalline silicon. One or plural other (second) absorber(s) may be made of a variety of materials, each of which efficiently uses other spectral ranges of the solar spectrum for photovoltaic energy conversion. The tandem solar cell is monolithic, i.e. the individual sub-cells are connected in series and their absorbers are preferably stacked substantially parallel to one another. The side of the crystalline silicon absorber facing the adjacent absorber made of a material other than crystalline silicon has a charge carrier selective contact. If the crystalline silicon absorber is embedded between two absorbers made of other materials, both sides of the silicon absorber have charge carrier selective contacts. According to the present invention, the charge carrier selective contacts consist of a thin interfacial dielectric (e.g. an interfacial oxide), for example a layer of silicon dioxide being only a few nanometers thick, and an amorphous or partially crystalline or polycrystalline layer predominantly (i.e. to more than 50%) consisting of silicon deposited thereon. The latter may be, for example, n-doped, whereby the charge carrier selective contact would efficiently transfer the electrons generated in the silicon absorber to the adjacent layers and block the holes generated in the silicon absorber near the interface between the silicon absorber and the interface oxide. Alternatively, the amorphous or partially crystalline or polycrystalline layer predominantly consisting of silicon may be p-doped, whereby the charge carrier selective contact would efficiently pass the holes generated in the silicon absorber to the adjacent layers and block the electrons generated in the silicon absorber near the interface between the silicon absorber and the interface oxide.

If the amorphous or partially crystalline or polycrystalline layer, which consists predominantly of silicon, is doped sufficiently, a tunnel contact may form between this layer and the adjacent layer.

Without limiting the invention, aspects and embodiments may be regarded as being based, among other things, on the knowledge and ideas described below.

As noted in the introduction, it was recognized that for terrestrial non-concentrating or low-concentration applications, low-cost tandem solar cell concepts may be used, e.g. monolithically built on a relatively low-cost silicon substrate such as a silicon wafer. It is considered advantageous to use the silicon substrate not only as a mechanical carrier but also as one of at least two active absorbers in the tandem solar cell structure. It may be assumed that the interface between the crystalline silicon and the adjacent layer, which belongs to the adjacent sub-cell made of another material, has a high density of interface states. For example, if the latter layer is also crystalline, it could have a different lattice constant than silicon. Even if the layer adjacent to the crystalline silicon and belonging to the adjacent sub-cell made of another material has an amorphous microstructure, a high density of defect states at the interface between this layer and the crystalline silicon is likely.

At these interface states, the pairs of charge carriers including electrons and holes generated in the silicon absorber may recombine, which would significantly reduce cell performance.

It has now been recognized that it would be advantageous to passivate the interface between the crystalline silicon and the adjacent layer, which belongs to the adjacent sub-cell made of another material, i.e. to minimize the interface state density and thus the recombination losses. Dielectric layers deposited on the crystalline silicon, which are usually used for passivation in solar cells with only one absorber of crystalline silicon, are disadvantageous for the solar cell structure according to the present invention. In full-surface deposition, such dielectric layers would electrically insulate the silicon sub-cell from the adjacent sub-cell, which would not ensure the required highly conductive connection of all sub-cells. The local opening of the dielectric insulation layer usually used for solar cells with only one crystalline silicon absorber would imply a lateral current flow within the sub-cells. The transverse conductivity necessary for this in all sub-cells for both types of charge carriers—electrons and holes—is generally not given in the solar cell structure according to the present invention, at least not in the typically very thin sub-cells made of a material other than silicon.

A charge carrier selective contact consisting for example of a thin interfacial oxide and a doped, amorphous or partially crystalline or polycrystalline layer deposited thereon, predominantly consisting of silicon, which charge carrier selective contact is located on the surface of the silicon absorber facing the adjacent sub-cell, offers decisive advantages here: On the one hand, it ensures excellent passivation of the surface of the silicon absorber and thus minimizes recombination losses occurring at this point. On the other hand, such a charge carrier selective contact also passes a charge carrier type, i.e. electrons in the case of an n-doped and holes in the case of a p-doped amorphous or partially crystalline or polycrystalline silicon layer on the interface oxide, over the entire surface to the adjacent sub-cell. Thus, the current flow preferably takes place purely vertically, and a lateral transverse conductivity in each sub-cell is not necessary for both types of charge carriers.

It was also recognized that in the case of a monolithic construction of a tandem solar cell, a highly conductive electrical connection of the sub-cells through tunnel contacts is advantageous. For this purpose, high doping in the adjacent layers forming the tunnel contact is advantageous, since high doping implies small space charge region widths and thus high tunnel probabilities. In order to meet this requirement on the side of the silicon sub-cell, the silicon absorber could be highly doped on its surface. However, a high doping introduced directly into the crystalline silicon also implies significant recombination losses, since the minority charge carrier lifetime in the highly doped range is very short due to Auger recombination.

Here too, a charge carrier selective contact, preferably applied directly to the surface of the silicon absorber, the charge carrier selective contact consisting for example of a thin interfacial oxide and a doped, amorphous or partially crystalline or polycrystalline silicon layer deposited on it, offers clear advantages: Since the minority charge carriers are already blocked at the interface between the silicon absorber and the interface oxide, they do not reach the amorphous or partially crystalline or polycrystalline silicon layer deposited on them. The minority carrier lifetime in the latter layer is therefore irrelevant. Therefore, the doping of the amorphous or partially crystalline or polycrystalline silicon layer may be sufficiently high (i.e. for example higher than $10^{18}$, preferably higher than $10^{19}$ and further preferably higher than $10^{20}$ cm$^{-3}$) to ensure a conductive tunnel contact to the adjacent sub-cell without thereby implying losses due to Auger recombination in this layer.

It was also recognized that in a monolithically constructed tandem solar cell, which corresponds to a series connection of all sub-cells, the current strength through all sub-cells must be the same. This requires a design of the individual sub-cells in such a way that the generation current in each sub-cell is equal. If this is not the case, undesirable compensating currents flow inside the tandem cell, which may significantly impair the cell performance. An exact adjustment of the generation current in all sub-cells is demanding. Further boundary conditions may set limits, for example a limited maximum thickness of sub-cells made of a material other than crystalline silicon.

According to an embodiment of the present invention, it could be advantageous to use the thickness and/or the doping of the amorphous or partially crystalline or polycrystalline silicon layer as an additional degree of freedom for fine adjustment of the generation currents. Depending on thickness and doping, constructive or destructive interferences may be used to either reflect some of the incident radiation back into the sub-cell from a material other than crystalline silicon or to transmit it specifically into the silicon sub-cell. Depending on the doping and thickness, absorption takes place in the amorphous or partially crystalline or polycrystalline silicon layer, for example combined with the excitation of free charge carriers in higher-energy states. This light is then no longer available for the generation of electron-hole pairs in the silicon absorber, so that the generation current in the silicon sub-cell is reduced. This reduction corresponds to an optical loss. Nevertheless, it may be advantageous for the overall performance of the cell to accept this optical loss in order to minimize electrical losses due to a deviation of the generation currents in the individual sub-cells.

It has also been recognized that the above advantages may also be achieved with other charge carrier selective contacts, i.e. with alternatives to the double layer consisting of a thin interfacial oxide and a doped, amorphous or partially crystalline or polycrystalline layer, predominantly consisting of silicon, deposited thereon.

For example, heterojunctions between the crystalline silicon absorber and a hydrogen-containing amorphous silicon layer deposited thereon have similar properties, especially with regard to excellent surface passivation.

Nevertheless, charge carrier selective contacts consisting of a doped, amorphous or partially crystalline or polycrystalline layer consisting predominantly of silicon deposited on a thin interfacial oxide offer an important advantage for integration into a cell production process: The electrical properties of these charge carrier selective contacts are very temperature stable and therefore allow the application of subsequent process steps with process temperatures of up to 1000° C. and above. In contrast, heterojunctions between the crystalline silicon absorber and the hydrogen-containing amorphous silicon layers deposited on it degrade already at temperatures above 200° C., which implies a strong restriction with regard to possible manufacturing processes for the tandem solar cell.

It was also recognized that the tandem solar cell structure according to the present invention provides great flexibility with regard to possible materials for the sub-cells not consisting of crystalline silicon. Sub-cells with absorbers of III-V, II-VI and I-III-VI compound semiconductors, with absorbers of perovskites, and with absorbers of germanium or amorphous silicon would be conceivable. In all cases it may be advantageous to, on the surface of the silicon absorber which is oriented towards an adjacent absorber, deposit a charge carrier selective contact consisting of a thin interfacial oxide (or, as the case may be, another interfacial dielectric) and a doped, amorphous or partially crystalline or polycrystalline layer, predominantly consisting of silicon, deposited thereon, since its electrical and optical properties are independent of the type of the adjacent layers.

BRIEF DESCRIPTION OF THE DRAWINGS

Further features and advantages of the present invention become apparent to a skilled person from the following description of exemplary embodiments and with reference to the accompanying drawings, whereby neither the description nor the drawings are to be interpreted as restrictive of the invention.

The details shown in the figures are only schematically illustrated and not reproduced to scale. In particular, the layer thicknesses and proportions shown do not correspond to actual conditions in which layers applied to a substrate are considerably thinner than those shown in the figures.

DETAILED DESCRIPTION OF THE PREFERRED EMBODIMENTS

Figure 1:
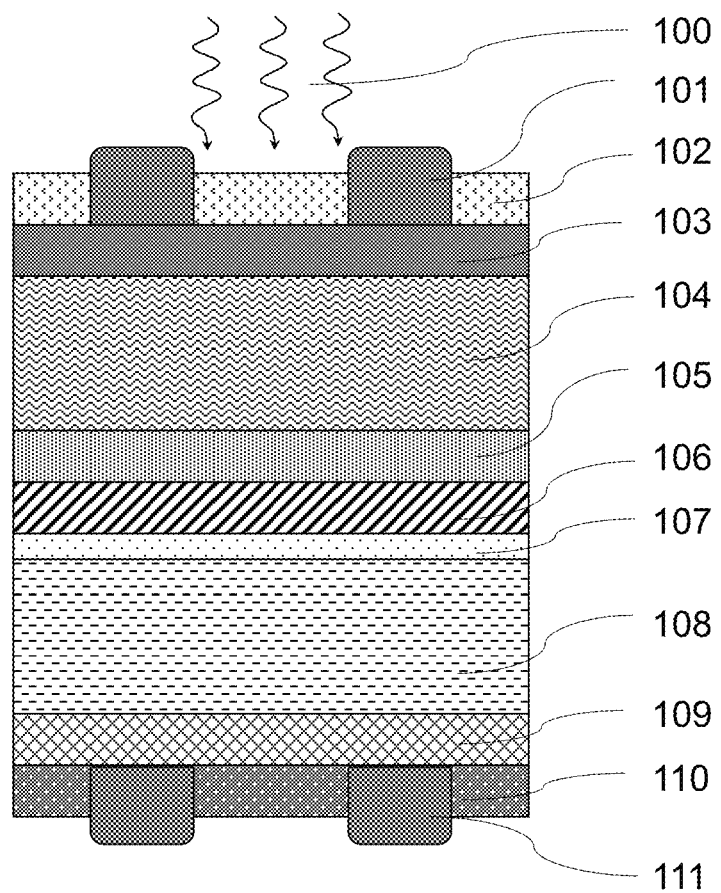
FIG. 1 and FIG. 2 show a schematic representation of tandem solar cells according to possible embodiments of the present invention.

FIG. 1 shows a schematic representation of a tandem solar cell according to the first of two preferred embodiments of the present invention.

As shown in FIG. 1, the tandem solar cell has two different absorbers 104, 108 made of different materials. Alternatively, three or more different absorber materials could be used. In any case, according to the present invention, a first absorber is made of silicon (108 in FIG. 1).

The silicon absorber 108, for example, may be a wafer made of crystalline, in particular monocrystalline or multi-crystalline silicon. If necessary, saw damage was removed from the surfaces of the silicon absorber 108. The silicon absorber 108 typically has thicknesses in the range of 30 to 500 µm, preferably 50 to 300 µm. Lateral dimensions typically range from $0.1 \times 0.1$ cm$^2$ to $200 \times 200$ cm$^2$. The silicon absorber 108 may be either p-doped, n-doped or undoped or intrinsic. The silicon absorber 108 preferably has a uniform doping type, i.e. is doped p over its entire thickness, doped n over its entire thickness or undoped or intrinsic over its entire thickness. Doping concentrations may vary over the thickness. A possible surface morphology of the silicon absorber 108 is a planar front and back, as shown in FIG. 1. Alternatively, for example, the front and/or back of the silicon absorber may be textured.

The second absorber 104 is made of a material other than silicon. In the embodiment of the present invention shown in FIG. 1, the second absorber 104 is made of a material largely transmitting light with photon energies above the silicon band gap of 1.12 eV but below an energy of, for example, 1.2-2.2 eV or 1.2-1.9 eV, preferably from 1.4-1.8 eV to the underlying silicon absorber 108, and effectively absorbing light with higher photon energies and using it to generate electron-hole pairs. Alternatively, the absorber 108 could also be made of a material which absorbs light with photon energies below the silicon band gap of 1.12 eV and uses it to generate electron-hole pairs, in which case the second absorber 104, unlike in FIG. 1, would be on the side of the silicon absorber 108 remote from the illumination 100.

Possible materials for the second absorber 104 according to the embodiment of the invention shown in FIG. 1 are semiconductors with a higher band gap than silicon, for example compound semiconductors from the III-V, II-VI and I-III-VI material class, organic materials with an energetic distance between the highest occupied and the lowest unoccupied energy level above 1.3 eV, as well as a compound of organic and inorganic substances, for example from the material class of perovskites. The thickness of the second absorber 104 shall be adapted to the respective material, whereby the diffusion length of the minority charge carriers in the absorber 104 implies an upper limit, the requirement for effective absorption of the light implies a lower limit with respect to the thickness of the absorber 104. For example, for a second absorber 104 from the III-V semiconductor material class with direct bandgap, the thickness of the absorber 104 would be in the range of 0.05-50 µm, preferably in the range of 0.5 µm-5 µm. The preferred thickness for a second absorber 104 from the Perovskite material class would be in a range of 0.05 µm-3 µm. The second absorber may have a uniform doping type, i.e. p-doped over its entire thickness, n-doped over its entire thickness or undoped or intrinsic over its entire thickness. Doping concentrations may vary over the thickness.

Central to the invention is the double layer adjacent to the silicon absorber 108, the double layer consisting for example of a thin interfacial oxide 107 and an amorphous or partially crystalline or polycrystalline silicon layer 106 being in the case of the embodiment shown in FIG. 1 p-doped. Together, the layers 107 and 108 form a so-called charge carrier selective contact. In the embodiment of FIG. 1, this charge carrier selective contact is transparent to the holes generated in the silicon absorber 108 and passes them efficiently to the layers above. However, in the embodiment of FIG. 1, the electrons generated in the silicon absorber 108 are blocked near or at the interface between the silicon absorber 108 and the interfacial oxide 107 and thus cannot enter the layers above. This minimizes recombination losses on the surface of the silicon absorber covered with layers 107, 106, regardless of the properties of the layers arranged above. The charge carrier selective contact consisting of the double layer 107, 106 is located on the side of the silicon absorber 108 facing the other absorber 104. If, other than shown in FIG. 1, the other absorber 104 is located on the side of the absorber 108 facing away from light or if a third absorber is present there, the side of the silicon absorber 108 facing away from light would also be limited by such a charge carrier selective contact.

The interface oxide 107 is partly referred to in the literature as tunnel oxide, wherein the transport of charge carriers through this oxide does not necessarily have to be based on tunneling. The interface oxide 107 may be applied to the silicon absorber 108 in various ways. For example, thermal oxidations, wet chemical oxidation, oxidations by irradiation in the presence of ozone, and chemical vapor phase deposition processes may be considered. The preferred thickness of the interface oxide 107 is in the range 0.5-5 nm. The amorphous or partially crystalline or polycrystalline silicon layer 106 may also be deposited using various processes. Chemical vapour deposition processes, supported either by plasma excitation or thermal excitation, are suitable for this purpose. Alternative processes such as sputtering or the printing or spin coating of silicon-containing materials may also be used to deposit the amorphous or partially crystalline or polycrystalline silicon layer 106. The p-doping of layer 106 required in the embodiment represented in FIG. 1 may be carried out either in-situ during deposition or subsequently. Processes such as thermal diffusion from the gas phase, ion implantation with subsequent healing or the application of dopants by means of a printing process or spin coating and subsequent thermal driving are possible for subsequent doping. The dopant concentration in the amorphous or partially crystalline or polycrystalline silicon layer 106 should preferably be more than $10^{18}$ cm$^{-3}$ to allow a generation of a tunnel contact to the layer 105 above. The layer 105 above serves in this case for the extraction of electrons from the first absorber 104 and is usually doped opposite to the amorphous or partially crystalline or polycrystalline silicon layer 106. To allow tunneling, this layer 105 above may be doped to a similar degree as the amorphous or partially crystalline or polycrystalline silicon layer 106, i.e. a doping concentration may preferably be more than $10^{18}$ cm$^{-3}$. The thickness of the amorphous or partially crystalline or polycrystalline silicon layer 106 is typically in the range 5-1000 nm, preferably in the range 10-300 nm. It may be varied specifically to adapt the current density generated in the silicon absorber 108 to the current density generated in the absorber 104 by varying the interference and/or absorption in layer 106. Whether the silicon layer 106 is amorphous, partially crystalline or polycrystalline depends on the deposition conditions and/or the thermal treatment of this layer, the microstructure of the layer 106 being generally irrelevant to the invention in question.

In addition to these components described in detail, the tandem solar cell according to FIG. 1 may have other structures, the exact design of which is not relevant for this invention. These are according to FIG. 1:

A layer 103 for extracting holes from the absorber 104 and a layer 105 for extracting electrons from the absorber 104. These may be for example suitably doped semiconductor layers, especially if the absorber 104 itself is made of a semiconductor material, or materials which form a heterojunction to the absorber 104 with a suitable electronic structure or with suitable band alignment. In the embodiment of the invention shown in FIG. 1, the layer 105 for the extraction of electrons from absorber 104 is adjacent to the charge carrier selective contact 107, 106, which is transparent for holes from silicon absorber 108. A tunnel contact forms between the p-doped amorphous or partially crystalline or polycrystalline silicon layer 106 and the layer 105 for the extraction of electrons from the absorber 104. The layer 105 itself may have a high selectivity, i.e. it may be transparent or permeable for the electrons generated in the absorber 104, block the holes generated in the absorber 104 and thus minimize recombination on the side of the absorber 104 covered by the layer 105.

Both, the layer 105 and the layer 103 should be as transparent as possible to light over a wide range of the solar spectrum.

A layer 109 for extracting electrons from the silicon absorber 108. This may, for example, consist of n-doped crystalline silicon and either, as shown in FIG. 1, cover the entire back of silicon absorber 108, or be limited to the regions of the back contacts 111 only. Alternatively, the layer 109 may also consist of several sublayers, e.g. an interface oxide and an n-doped amorphous or partially crystalline or polycrystalline silicon layer. Further realization possibilities of layer 109 are semiconductor materials other than crystalline silicon, which form a heterojunction with a suitable band structure to the silicon absorber 108. Organic layers with suitable electronic properties are also possible.

A layer 102 to reduce the reflection at the front side of the solar cell and/or to passivate it. This should be as transparent as possible for light over the entire solar spectrum.

A layer 110 to increase the internal reflection at the back side of the solar cell and/or to passivate it. This may be a dielectric layer or a stack of dielectric layers, for example silicon oxide, silicon nitride or aluminum oxide. A structuring of the back side of the silicon absorber to increase internal reflection is also conceivable.

A front side metallization 101 as well as a back side metallization 111. While the front side metallization 101, if it is not made of a transparent material, cannot be applied over the entire surface, a full-surface back side metallization is quite possible, other than shown in FIG. 1. Possible materials are highly conductive metals such as copper, silver, gold, platinum, nickel, titanium, palladium and aluminum, possibly in combination with other components to improve contact with layers 103 and 110.

It is conceivable that special designs of these structures take over several functions simultaneously, so that individual structures become superfluous. For example, layer 103 for extracting holes from the absorber 104 may simultaneously reduce the reflection of the front side of the solar cell so that the layer 102 is superfluous.

The possible production processes for the layers 102, 103, 104, 105 are strongly dependent on the materials used. If one of these layers consists of a semiconductor material, it may be deposited directly onto the underlying layers by sputtering, evaporation, molecular beam epitaxy, chemical vapor deposition or another process. Alternatively, the absorber 104, possibly together with one or more of the layers 105, 103, 102, 101, could be produced separately and later mechanically, electrically and optically connected to the underlying layers. Methods such as bonding, but also adhering with a conductive, transparent adhesive, may be used for this purpose. If one of the layers consists of an organic material or a material from the perovskite class, additional deposition processes such as spin coating and various printing processes are possible. As a rule, these manufacturing processes are associated with a certain temperature budget, for example with process temperatures above 200° C. The fact that the electrical properties of the charge carrier selective contact consisting of the thin interfacial oxide 107 and the p-doped, amorphous or partially crystalline or polycrystalline silicon layer 106 do not necessarily degrade even at process temperatures of up to 1100° C. enables the applicability of temperature-afflicted manufacturing processes for the layers 105, 104, 103, 102.

Figure 2:
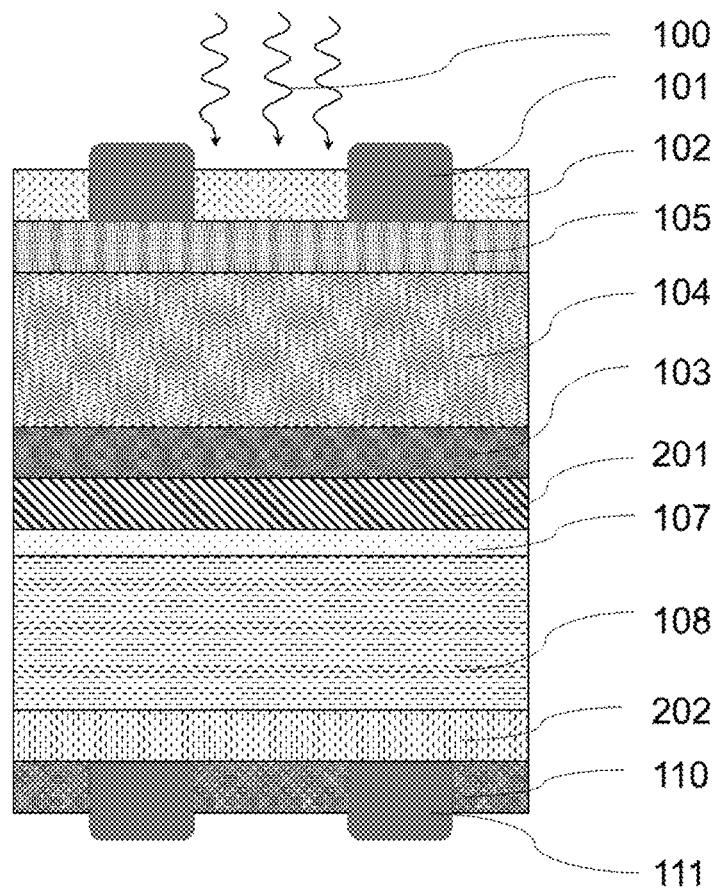

FIG. 2 shows a schematic representation of a tandem solar cell according to the second of two preferred embodiments of the present invention.

The substantial difference to the embodiment shown in FIG. 1 is that the amorphous or partially crystalline or polycrystalline silicon layer 201 is not p-doped like the layer 106 but is n-doped. This makes the charge carrier selective contact consisting of the interface oxide 107 and the n-doped amorphous or partially crystalline or polycrystalline silicon layer 201 transparent or permeable for the electrons generated in the silicon absorber 108 and passes them efficiently to the layers above. However, the holes generated in the silicon absorber 108 are blocked close to or at the interface between the silicon absorber 108 and the interface oxide 107 in the embodiment shown in FIG. 2 and thus cannot enter the layers above. This minimizes recombination losses at the surface of the silicon absorber covered with the layers 107, 201, regardless of the properties of the layers above. The n-doped amorphous or partially crystalline or polycrystalline silicon layer 201 is identical to the p-doped amorphous or partially crystalline or polycrystalline silicon layer 106 in terms of layer thicknesses, doping and manufacturing processes, so that reference is made here to the detailed description given above.

On the side of the silicon absorber 108 facing away from the light, the extraction of holes generated in the absorber 108 is necessary in accordance with the embodiment of the invention shown in FIG. 2. This task is performed by the layer 202. This layer may, for example, consist of p-doped crystalline silicon and either, as shown in FIG. 2, cover the entire back side of the silicon absorber 108, or may be limited to the areas of the back contacts 111 only. Alternatively, the layer 202 may also consist of several sublayers, e.g. an interface oxide and a p-doped amorphous or partially crystalline or polycrystalline silicon layer. Other possibilities of realisation for layer 201 are semiconductor materials other than crystalline silicon, which form a heterojunction with a suitable band structure to the silicon absorber 108. Organic layers with suitable electronic properties are also possible.

Furthermore, the positions of the layer 103 for extracting holes from the absorber 104 and of the layer 105 for extracting electrons from the absorber 104 in FIG. 2 are interchanged compared to FIG. 1. The layer 103 for extracting holes from the absorber 104 is now located on the side of the absorber 104 facing away from light and thus borders directly on the n-doped amorphous or partially crystalline or polycrystalline silicon layer 201. A tunnel contact may form between the layers 201 and 103 according to the embodiment of the invention shown in FIG. 2. The different realization possibilities of the layers 103, 105 are identical to the description of both layers given above.

Finally, possible aspects of the invention are indicated as follows:

1. Solar cell comprising at least two different absorber materials (104 and 108) for converting radiant energy into electrical energy with absorption in different spectral ranges, respectively, wherein:
(a) the solar cell is monolithically configured
(b) an absorber 108 consists of crystalline silicon
(c) there is a charge carrier selective contact on the side of silicon absorber 108 directed to the adjacent absorber 104 which is more permeable to one type of charge carrier—holes or electrons—than to the other type of charge carrier, and which well passivates the corresponding surface of silicon absorber 108
(d) the charge carrier selective contact is formed of a thin interface oxide 107 and an amorphous, partially crystalline or polycrystalline layer applied thereto, the layer mainly consisting of silicon, the layer (106) either being p-doped or the layer (201) being n-doped.

2. Solar cell according to aspect 1, wherein the amorphous, partially crystalline or polycrystalline silicon layer is highly p-doped (106) or highly n-doped (201) and thus enables a tunnel contact with the layer (105 or 103) applied thereto.

3. Solar cell according to aspect 1, wherein interference effects and/or light absorption in the amorphous, partially crystalline or polycrystalline silicon layer (106 or 201) are selectively adjusted by adjusting the layer thickness and/or the doping to match the current density generated in the silicon absorber 108 to the current density generated in the superimposed absorber 104.

4. Manufacturing process for a solar cell according to aspect 1, wherein the stability of the electrical properties of the charge carrier selective contact consisting of thin interface oxide 107 and an amorphous, partially crystalline or polycrystalline layer (106 or 201) mainly consisting of silicon applied thereto at process temperatures above 400° C. is essential for the applicability of at least one of the following process steps for producing the structures 101-105.

5. Solar cell according to one of the preceding aspects, wherein an absorber 104 located on the side facing to and/or the side facing away from solar irradiation 100 consists of a perovskite material.

6. Solar cell according to one of the preceding aspects, wherein an absorber 104 located on the side facing to and/or the side facing away from solar irradiation 100 consists of a III-V compound semiconductor.

7. Solar cell according to one of the preceding aspects, wherein an absorber 104 located on the side facing to and/or the side facing away from solar irradiation 100 consists of an I-III-VI compound semiconductor.

8. Solar cell according to one of the preceding aspects, wherein an absorber 104 located on the side facing to and/or the side facing away from solar irradiation 100 consists of a II-VI compound semiconductor.

9. Solar cell according to one of the preceding aspects, wherein an absorber 104 located on the side facing away from solar irradiation 100 consists of germanium or a silicon-germanium mixture.

10. Solar cell according to one of the preceding aspects, wherein an absorber 104 located on the side facing the solar irradiation 100 consists of amorphous silicon.

In summary, according to an embodiment, a tandem solar cell structure with the following features is described:
(a) Monolithic structure with at least two different absorber materials (104 and 108) for photovoltaic energy conversion
(b) An absorber 108 consisting of crystalline silicon
(c) A charge carrier selective contact located on the side of the silicon absorber 108 directed to the adjacent absorber 104
(d) Configuration of the charge carrier selective contact of a thin interface oxide 107 and an amorphous, partially crystalline or polycrystalline layer applied thereto, mainly consisting of silicon, either p (106) or n doped (201).

The charge carrier selective contact made up of layers 107 and 106 or 201, respectively, ensures excellent surface passivation of the crystalline silicon absorber 108, as well as selective extraction of a charge carrier type from the latter over the entire surface. Thus, a vertical current flow is achieved, so that lateral transverse conductivity is not required in every sub-cell. The formation of a tunnel contact to the adjacent layer may be achieved by high doping of the layers 106 and 201. The thickness and/or the doping of the layer 106 or 201, respectively, may be used to match the generation currents in the individual sub-cells. The temperature stability of the layers 107, 106 or 201, respectively, allows the application of subsequent manufacturing steps with temperatures >400° C.

LIST OF REFERENCE SIGNS

100: Sunlight
101: Frontside metallization
102: Frontside passivation and anti-reflection layer
103: Layer for extraction of holes from first absorber
104: first absorber made of a material other than crystalline silicon
105: Layer for extraction of electrons from first absorber
106: layer of p-doped, amorphous or partially crystalline or polycrystalline silicon
107: Interface oxide
108: second absorber made of crystalline silicon
109: Layer for extraction of electrons from second absorber
110: Backside passivation and Backside mirror
111: Backside metallization
201: layer of n-doped, amorphous or partially crystalline or polycrystalline silicon
202: Layer for extraction of holes from second absorber

The invention claimed is:

1. A solar cell comprising at least two different absorbers of different materials for converting radiant energy into electrical energy with absorption in different spectral ranges, respectively, wherein:
 (a) the solar cell is configured monolithic,
 (b) a first absorber is made of crystalline silicon,
 (c) on one side of the first absorber directed to an adjacent second absorber, there is a charge carrier selective contact which is more permeable to one type of charge carrier selected from a group comprising holes and electrons than to the respective other type of charge carrier and which well passivates the corresponding surface of the first absorber, and
 (d) the charge carrier selective contact is formed from a layer of a thin interfacial dielectric and an amorphous, partially crystalline or polycrystalline layer applied thereto, mainly comprising silicon, the amorphous, partially crystalline or polycrystalline layer being either p-doped or n-doped, the layer of the thin interfacial dielectric being arranged such as having an interface to the first absorber,
the amorphous, partially crystalline or polycrystalline layer having applied thereto an extraction layer for extracting from the second absorber a type of charge carriers opposite to the one type of charge carrier to which the charge carrier selective contact is more permeable.

2. The solar cell according to claim 1, wherein the amorphous, partially crystalline or polycrystalline silicon layer is doped to such an extent that a tunnel contact with the extraction layer applied thereto is enabled.

3. The solar cell according to claim 1, wherein interference effects and/or light absorption in the amorphous, partially crystalline or polycrystalline silicon layer are selectively adjusted by adjusting a layer thickness and/or a doping to match a current density generated in the first absorber to a current density generated in the second absorber.

4. The solar cell according to claim 1, wherein the interfacial dielectric is an interfacial oxide.

5. The solar cell according to claim 1, wherein the second absorber on the side facing to and/or the side facing away from the solar irradiation includes a perovskite material.

6. The solar cell according to claim 1, wherein the second absorber arranged on the side facing to and/or the side facing away from the solar irradiation includes a III-V compound semiconductor.

7. The solar cell according to claim 1, wherein the second absorber arranged on the side facing to and/or the side facing away from the solar irradiation includes an I-III-VI compound semiconductor.

8. The solar cell according to claim 1, wherein the second absorber arranged on the side facing to and/or the side facing away from the solar irradiation includes a II-VI compound semiconductor.

9. The solar cell according to claim 1, wherein the second absorber arranged on the side facing away from the solar irradiation includes germanium or a silicon-germanium mixture.

10. The solar cell according to claim 1, wherein the second absorber arranged on the side facing to the solar irradiation includes amorphous silicon.

11. The solar cell according to claim 1, wherein the interfacial dielectric is any interfacial dielectric excluding an interfacial oxide.

12. The solar cell according to claim 2, wherein the amorphous, partially crystalline or polycrystalline silicon layer is doped to a dopant concentration of more than $10^{18}$ cm$^{-3}$.

13. The solar cell according to claim 1, wherein the extraction layer applied to the amorphous, partially crystalline or polycrystalline layer comprises a doped semi-conductor layer.

14. The solar cell according to claim 13, wherein the semi-conductor layer is doped opposite to the amorphous, partially crystalline or polycrystalline layer.

15. The solar cell according to claim 14, wherein the doped semi-conductor layer is doped to a dopant concentration of more than $10^{18}$ cm$^{-3}$.

* * * * *